(12) United States Patent
Wang et al.

(10) Patent No.: US 11,062,913 B2
(45) Date of Patent: Jul. 13, 2021

(54) ETCHING PROCESS WITH IN-SITU FORMATION OF PROTECTIVE LAYER

(71) Applicant: YANGTZE MEMORY TECHNOLOGIES CO., LTD., Wuhan (CN)

(72) Inventors: Yu Qi Wang, Wuhan (CN); Wenjie Zhang, Wuhan (CN); Hong Guang Song, Wuhan (CN); Lipeng Liu, Wuhan (CN); Lianjuan Ren, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/365,734

(22) Filed: Mar. 27, 2019

(65) Prior Publication Data

US 2020/0258757 A1     Aug. 13, 2020

Related U.S. Application Data

(63) Continuation of application No. PCT/CN2019/074785, filed on Feb. 11, 2019.

(51) Int. Cl.
*H01L 21/00*     (2006.01)
*H01L 21/311*     (2006.01)
(Continued)

(52) U.S. Cl.
CPC .. *H01L 21/31144* (2013.01); *H01L 21/02118* (2013.01); *H01L 21/0337* (2013.01);
(Continued)

(58) Field of Classification Search
None
See application file for complete search history.

(56) References Cited

U.S. PATENT DOCUMENTS 6,989,317 B1   1/2006   Radens et al.
8,928,089 B2   1/2015   Zhu et al.
(Continued)

FOREIGN PATENT DOCUMENTS

CN   102254914 A   11/2011
CN   107706182 A   2/2018
(Continued)

OTHER PUBLICATIONS

Combined Chinese Office Action and Search Report dated Nov. 12, 2019 in Chinese Patent Application No. 201980000316.1, 9 pages.
(Continued)

*Primary Examiner* — Reema Patel
(74) *Attorney, Agent, or Firm* — Oblon, McClelland, Maier & Neustadt, L.L.P.

(57) ABSTRACT

In the disclosed method, a mask is formed on a microstructure. The mask includes a first pattern positioned over a first region of the microstructure and a second pattern positioned over a second region of the microstructure. A first etching process is performed to etch the microstructure according to the first and second patterns formed in the mask. The first etching process transfers the first and second patterns of the mask into the first and second regions of the microstructure, respectively. A protective layer is subsequently formed over the first pattern of the mask that is positioned over the first region of the microstructure. When the protective layer is formed, a second etching process is performed to etch the microstructure and transfer the second pattern of the mask further into the second region of the microstructure. The method also includes removing the mask and the protective layer from the microstructure.

20 Claims, 7 Drawing Sheets

(51) Int. Cl.
  *H01L 21/033* (2006.01)
  *H01L 21/02* (2006.01)
  *H01L 21/768* (2006.01)
  *H01L 27/11582* (2017.01)
  *H01L 21/28* (2006.01)

(52) U.S. Cl.
  CPC .... *H01L 21/0338* (2013.01); *H01L 21/31116* (2013.01); *H01L 21/76802* (2013.01); *H01L 27/11582* (2013.01); *H01L 21/0217* (2013.01); *H01L 21/0262* (2013.01); *H01L 21/02164* (2013.01); *H01L 21/02532* (2013.01); *H01L 21/02595* (2013.01); *H01L 29/40117* (2019.08)

(56) References Cited

U.S. PATENT DOCUMENTS

| | | | |
|---|---|---|---|
| 8,987,089 | B1 | 3/2015 | Pachamuthu et al. |
| 9,230,973 | B2 | 1/2016 | Pachamuthu et al. |
| 9,496,274 | B2 | 11/2016 | Pachamuthu et al. |
| 10,177,160 | B2 | 1/2019 | Pyon et al. |
| 2007/0275560 | A1* | 11/2007 | Nishimura .............. G03F 7/427 438/694 |
| 2008/0026585 | A1* | 1/2008 | Kim ........................ C03C 17/30 438/694 |
| 2009/0081879 | A1* | 3/2009 | Sukekawa ........ H01L 21/31144 438/735 |
| 2010/0213526 | A1 | 8/2010 | Wada et al. |
| 2011/0207323 | A1* | 8/2011 | Ditizio ................ B81C 1/00087 438/675 |
| 2011/0316088 | A1 | 12/2011 | Zhu et al. |
| 2014/0370709 | A1* | 12/2014 | Wu ..................... H01L 21/0273 438/696 |
| 2015/0076585 | A1 | 3/2015 | Pachamuthu et al. |
| 2015/0079742 | A1 | 3/2015 | Pachamuthu et al. |
| 2015/0079743 | A1 | 3/2015 | Pachamuthu et al. |
| 2015/0263029 | A1 | 9/2015 | Kim et al. |
| 2018/0247953 | A1 | 8/2018 | Lee |

FOREIGN PATENT DOCUMENTS

| | | |
|---|---|---|
| CN | 107731844 A | 2/2018 |
| CN | 107808884 A | 3/2018 |
| CN | 108417577 A | 8/2018 |
| CN | 108899324 A | 11/2018 |
| JP | 2018-195625 A | 12/2018 |
| TW | I635600 B | 9/2018 |
| TW | 201906143 A | 2/2019 |

OTHER PUBLICATIONS

International Search Report and Written Opinion dated Aug. 28, 2019 in PCT/CN2019/074785, 9 pages.

* cited by examiner

ETCHING PROCESS WITH IN-SITU FORMATION OF PROTECTIVE LAYER

RELATED APPLICATION

This application is a continuation of International Application No. PCT/CN2019/074785, filed on Feb. 11, 2019. The entire disclosure of the prior application is hereby incorporated by reference in its entirety.

BACKGROUND

A semiconductor memory, such as a NAND memory, is widely used in an integrated circuit. The semiconductor memory can function as a data storage component in the integrated circuit. As critical dimensions of the semiconductor memory shrink to the limits of common memory cell technologies, designers have been looking to techniques for stacking multiple planes of memory cells to achieve greater storage capacity, and achieve lower costs per bit.

A 3D-NAND memory device is an exemplary device of stacking multiple planes of memory cells to achieve greater storage capacity, and to achieve lower costs per bit. As 3D NAND technology migrates towards high density and high capacity, especially from 64 L to 128 L architecture, the number of devices, and the number of mask layers to make the devices have increased significantly. Each of the mask layers can mean an increased manufacturing cost and an increased manufacturing time. In addition, increased mask layers introduce process complexity, especially in a dry etching process and a photolithographic process.

SUMMARY

The inventive concepts relate to a novel etching process. In a related etching process, it is difficult to form patterns with different dimensions via a single mask layer. For example, in order to form a first and second patterns in a microstructure where the first pattern has a smaller critical dimension and/or a smaller depth than the second pattern, a first mask layer is normally required to form the first pattern, and a second mask layer is required to form the second pattern. In the disclosed etching process, the first and the second patterns of the microstructure are formed via a single mask layer. According to the disclosure, the first pattern can be formed by an etching process and then protected by an in-situ formed protective (or polymeric) layer. The etching process subsequently complete formation of the second pattern in the microstructure. The protective layer and the mask layer are removed thereafter. The disclosure provides a novel etching process that has a low cost and less process complexity by forming patterns with different dimensions in a single mask layer.

According to an aspect of the disclosure, a method for processing a wafer is provided. In the disclosed method, a mask is formed on a microstructure. The mask includes a first pattern that is positioned over a first region of the microstructure and a second pattern that is positioned over a second region of the microstructure. A first etching process is performed to etch the microstructure according to the first and second patterns formed in the mask. The first etching process transfers the first and second patterns of the mask into the first and second regions of the microstructure, respectively. A protective layer is subsequently formed over the first pattern of the mask that is positioned over the first region of the microstructure. When the protective layer is formed, a second etching process is performed. The second etching process etches the microstructure and transfers the second pattern of the mask further into the second region of the microstructure. The method also includes removing the mask and the protective layer from the microstructure.

In some embodiments, the mask that is formed on the microstructure includes the first pattern with a first critical dimension. The mask also includes second pattern of the mask over the second region with a second critical dimension. In an example, the first critical dimension is smaller than the second critical dimension.

In the disclosed etching process, the first region of the microstructure is protected by the protective layer during the second etching process.

In some embodiments, the first region of the microstructure includes a plurality of top channel contacts positioned in a dielectric layer. In the disclosed etching process, the first etching process transfers the first pattern of the mask into the first region of the microstructure to expose the plurality of top channel contacts and form a plurality of channel contact openings in the dielectric layer.

In an embodiment, the protective layer is formed to fill the plurality of channel contact openings and cover a top surface of the first pattern of the mask. The protective layer is formed by a processing gas that includes carbon element, hydrogen element, or fluorine element. A density, a thickness, and a composition of the protective layer can be adjusted by changing the carbon to hydrogen ratio in the processing gas.

In some embodiments, the second region of the microstructure includes a plurality of word lines. In the disclosed etching process, the second etching process etches the microstructure to transfer the second pattern of the mask further into the second region of the microstructure to expose the plurality of the word lines.

In an embodiment, the first and the second etching processes and the formation of the protective layer are performed in a same processing chamber. In yet another embodiment, the first and the second etching processes are performed in a first processing chamber and the protective layer is formed in a second processing chamber.

According to another aspect of the disclosure, a method for manufacturing a memory structure is provided. In the disclosed method, a mask stack is formed for pattern transfer on a memory structure. The memory structure is formed over a substrate and includes at least a channel region and a word line region. The mask stack has a first pattern that is positioned over the channel region and a second pattern that is positioned over the word line region. A first etching process is then performed. The first etching process etches the memory structure according to the first and second patterns formed in the mask stack to transfer the first and second patterns into the channel region and the word line region of the memory structure respectively.

When the first etching process is completed, a plurality of channel contact openings are formed in the channel region by the first etching process. Subsequently, a protective layer is formed over the first pattern of the mask stack that is positioned on the channel region of the memory structure. Upon the formation of the protective layer, a second etching process is performed. The second etching process etches the memory structure and transfers the second pattern of the mask stack further into the word line region of the memory structure. A plurality of word line contact openings are formed in the word line region by the second etching process. After the second etching process, the mask stack and the protective layer are removed from the channel region.

According to yet another aspect of the disclosure, a mask stack is formed for pattern transfer on a 3D-NAND structure. The 3D-NAND structure is formed over a substrate and includes a channel region and a staircase region. The channel region includes a plurality of top channel contacts disposed in a dielectric layer and the staircase region includes a plurality of word lines stacked in a staircase configuration. A first and a second patterns are formed in the mask stack. The first pattern is positioned over the channel region and a second pattern is positioned over the staircase region. The first pattern has a smaller critical dimension (CD) than the second pattern.

The 3D-NAND structure is subsequently etched according to the first and second patterns formed in the mask stack to transfer the first and second patterns of the mask stack into the 3D-NAND structure. The first pattern of the mask stack is transferred to the channel region to expose the plurality of top channel contacts and form a plurality of channel contact openings in the dielectric layer. A protective layer is then formed over the first pattern of the mask stack that is positioned over the channel region of the 3D-NAND structure. The protective layer covers the channel region and further fills the plurality of channel contact openings.

Upon the formation of the protective layer, the 3D-NAND structure is etched to transfer the second pattern of the mask stack further into the staircase region. The second pattern of the mask stack is transferred into the staircase region to expose the plurality of the word lines and form a plurality of word line contact openings in the staircase region. The mask stack and the protective layer are removed thereafter from the 3D-NAND structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
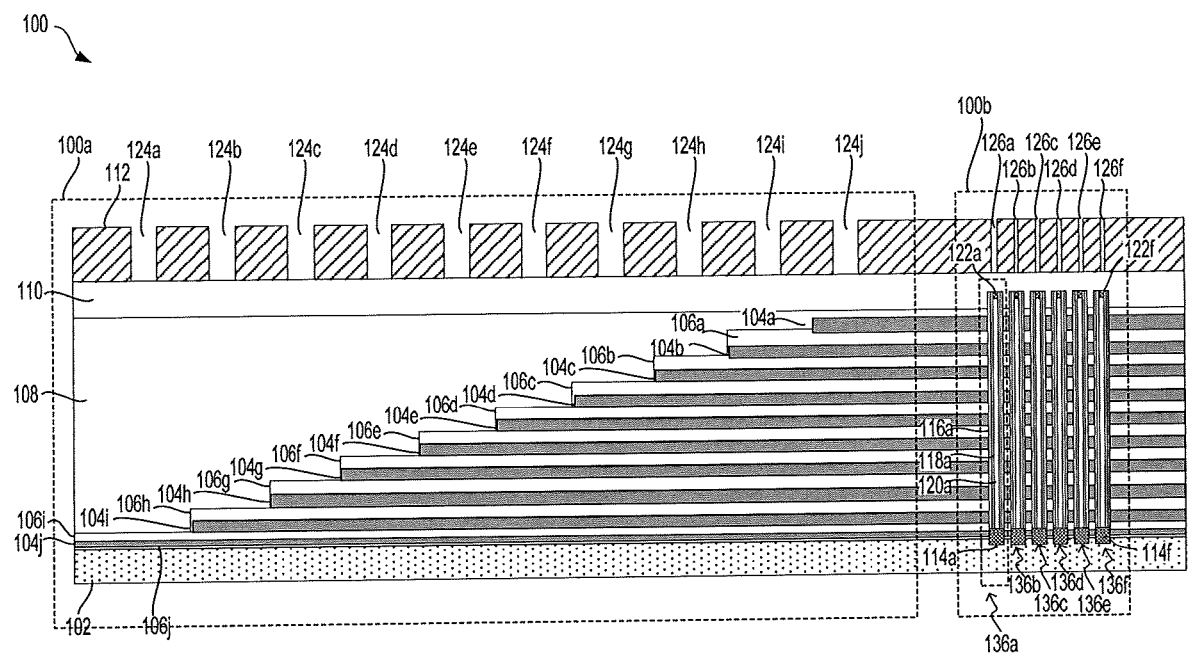
FIGS. 1 through 6 are cross-sectional and top down views of various intermediary steps of manufacturing a 3D-NAND structure, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of a portion of a 3D-NAND memory device 100 during a semiconductor manufacturing process in accordance with exemplary embodiments of the disclosure. The memory device 100 can be divided into two regions: a channel region (or first region) 100b and a staircase region (or second region) 100a. In the staircase region 100a, a plurality of word lines 104a-120j are sequentially stacked over a substrate 102. The plurality of word lines 104 are spaced apart from each other by a plurality of insulating layers 106a-106j. The word lines 104 and the insulating layer 106 are stacked in a staircase configuration, where a word line 104a and an insulating layer 106a have a smallest length, and a word line 104j and an insulating layer 106j have a largest length, as shown in FIG. 1. While shown with ten word lines, it should be understood that any number of word lines can be used.

In some embodiments, the substrate 102 may be a bulk silicon wafer heavily doped with a N-type dopant or a P-type dopant to form a N-well or P-well, respectively. The word lines 104 illustrated in FIG. 1 are formed using sacrificial layers that are made of SiN. The sacrificial layers can be removed and replaced with a high K layer and a metal layer. The high K layer can be made of aluminum oxide and the metal layer can be made of tungsten (W), for example. The word line 104 can have a thickness in a range from 10 nm to 100 nm, according to manufacturing requirements. In an embodiment of FIG. 1, the insulating layer 106 can be made of SiO with a thickness from 5 nm to 50 nm.

Still in staircase region 100a, a first dielectric layer 108 is deposited over the staircase that is formed by the word lines 104 and insulating layers 106 in the staircase region 100a. On the first dielectric layer 108, a second dielectric layer 110 is formed. Over the second dielectric layer 110, a mask stack 112 is deposited that includes a first pattern 126 and a second pattern 124. The second pattern 124 is positioned in the staircase region 100a. The second pattern 124 can have a cylindrical shape that includes side portions and a bottom portion to expose the second dielectric layer 110.

In an embodiment of FIG. 1, the first dielectric layer 108 can be made of SiO with a thickness in a range from 4 um to 8 um. The second dielectric layer 110 can also be made of SiO with a thickness in a range from 50 nm to 300 nm, depending on the technology requirements. The mask stack 112 can includes an amorphous carbon layer, a dielectric anti-reflection coating (DARC) layer, a bottom anti-reflective coating (BARC) layer, and a photo resist layer, depending on the manufacturing requirements.

In the channel region 100b of the memory device 100, a plurality of channel structure 136a-136f are includes. The channel structures 136 pass through the plurality of word lines 104 and the insulating layers 106. The channel structures 136 can have a cylindrical shape with sidewalls and a bottom region. Of course, other shapes are possible. The channel structures 136 are formed along a direction perpendicular to the substrate 102, and electrically coupled with the substrate 102 via bottom channel contacts 114. For example, a channel structure 136a is electrically coupled with the substrate 102 via a bottom channel structure 114a, as shown in FIG. 1. The channel structures 136 further include channel dielectric regions 116, channel layers 118, channel insulating layers 120, and top channel contacts 122. For example, the channel structure 136a has a channel dielectric region 116a, a channel layer 118a, a channel insulating layer 120a, and a top channel contact 122a.

Still referring to the channel region 110b, the channel structures 136 extends out from the first dielectric layer 108 and are encapsulated by the second dielectric layer 110. The first pattern 126 of the mask stack 112 is positioned over the channel region 110b. The first pattern 126 can have a cylindrical shape that includes side portions and a bottom portion to expose the second dielectric layer 110. In some embodiments, the first pattern 126 can have a smaller critical dimension (CD) than the second pattern 124. The patterns 124 and 126 can be formed according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

Figure 2A:
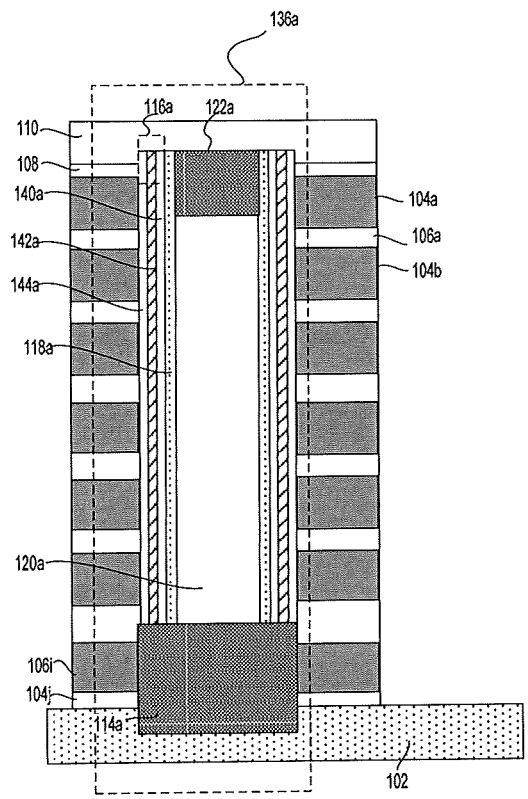
Figure 2B:
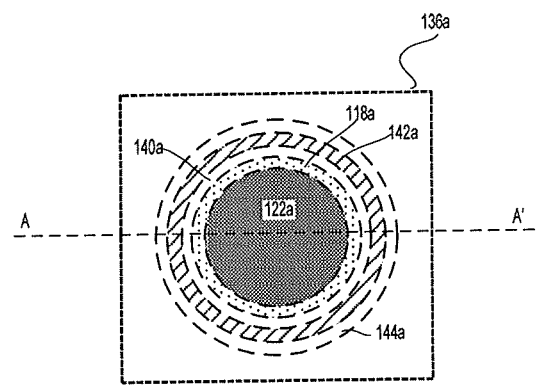

In FIGS. 2A/2B, an expanded cross-sectional and top down views of the channel structure 136a are illustrated. FIG. 2A is an expanded cross-sectional view of the channel structure 136a, and FIG. 2B is an expanded top down view of the channel structure 136a. The cross-sectional view in FIG. 2A is obtained from a plane same as the vertical plane containing line A-A' in FIG. 2B. Dashed lines in FIG. 2B indicate a perspective view.

As shown in FIGS. 2A/2B, the channel dielectric region 116a further includes a barrier layer 144a, a charge trapping layer 142a, and a tunneling layer 140a. The barrier layer 144a is formed along the sidewalls of the channel structure 136a and over the bottom channel contact 114a. The barrier layer 144a is in direct contact with the word lines 104 and the insulating layers 106. The charge trapping layer 142a is formed along the barrier layer 144a and over the bottom channel contact 114a. The tunneling layer 140a is formed along the charge trapping layer 142a and over the bottom channel contact 114a. The channel structure 136a further includes a channel layer 118a formed along the tunneling layer 140a and over the bottom channel contact 114a. A channel insulating layer 120a is formed over the channel layer 118a to fill the channel structure 136a.

In an embodiment of FIGS. 2A/2B, the barrier layer 144a is made of SiO. In another embodiment, the barrier layer 144a can include multiple layers, such as SiO and AlO. In an embodiment of FIGS. 2A/2B, the charge trapping layer 142a is made of SiN. In another embodiment, the charge trapping layer 142a can include a multi-layer configuration, such as a SiN/SiON/SiN multi-layer configuration. In some embodiments, the tunneling layer 140a can include a multi-layer configuration, such as a SiO/SiON/SiO multi-layer configuration. In an embodiment of FIGS. 2A/2B, the channel layer 118a is made of polysilicon via a furnace low pressure chemical vapor deposition (CVD) process.

As shown in FIGS. 2A/2B, the channel structure 136a can have a cylindrical shape. However, the present disclosure is not limited thereto, and the channel structures 136 may be formed in other shapes, such as a square pillar-shape, an oval pillar-shape, or any other suitable shapes.

Figure 3:
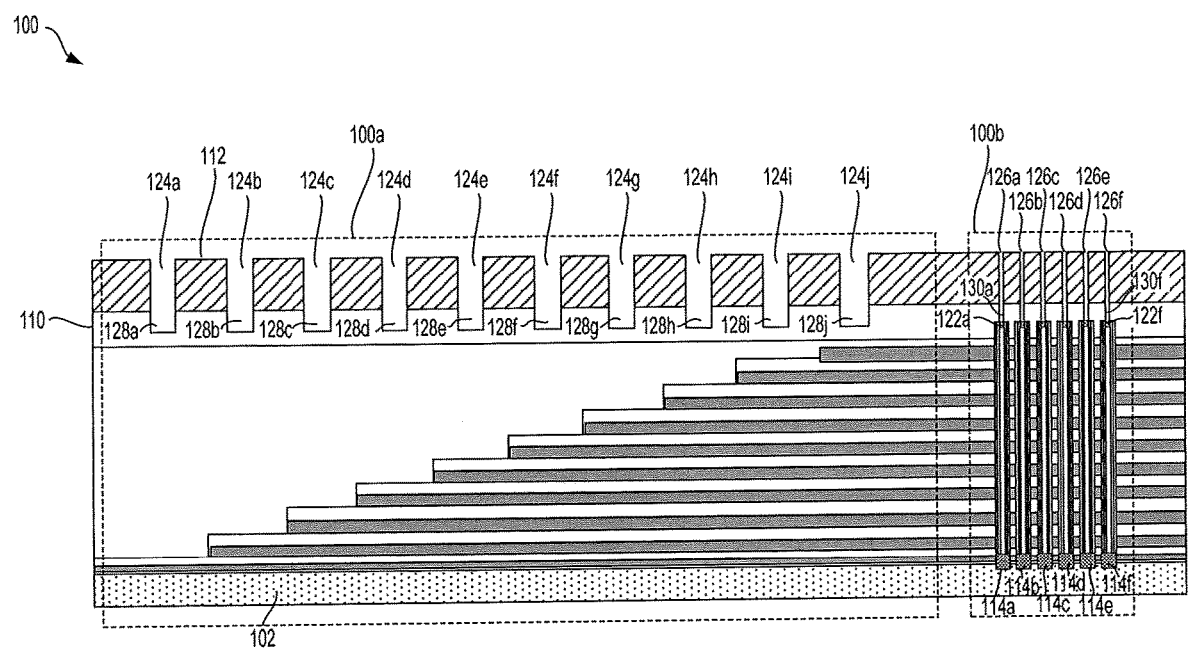

In FIG. 3, a first etching process is performed. The first etching process etches the memory device 100 according to the first pattern 126 and second pattern 124 formed in the mask stack 112. The first etching process transfers the first pattern 126 and second pattern 124 of the mask stack 112 into the channel region 100b and staircase region 100a of the memory device 100, respectively. Upon the completion of the first etching process, a plurality of first openings 128a-128j are formed in the staircase region 100a where the first openings 128 extend into the second dielectric layer 110. The first openings 128 can have a cylindrical shape that includes side portions and a bottom portion to extend into the second dielectric layer 110. In addition, a plurality of channel contact openings 130a-130j are formed in the channel region. The channel contact openings 130 can have a cylindrical shape that includes side portions and a bottom portion to extend into the second dielectric layer 110 and further expose the top channel contacts 122. For example, a channel contact opening 120a extends into the second dielectric layer 110 and exposes the top channel contact 122a, as shown in FIG. 3.

In some embodiments, the first openings 128 formed in the staircase region 100a can have a CD from 100 nm to 300 nm, and the channel contact openings 130 formed in the channel region 100b can have a CD from 20 nm to 80 nm, according to the design requirements. In some embodiments, the first etching process may include RIE (reactive ion etching) etching, ICP (inductively coupled plasma) etching, CCP (capacitive coupled plasma) etching, MERIE (magnetically enhanced reactive ion etching) etching, plasma etching, and/or other etching methods. During the first etching process, one or more suitable processing gases can be introduced into an etching chamber. The processing gases can be selected in that the processing gases can have a good etching selectivity between the second dielectric layer 110 (e.g., SiO) and the top channel contact 122 (e.g., polysilicon). Various processing gases can be selected in the first etching process, such as $CF_4$, $CHF_3$, $CH_2F_2$, $C_5F_8$, $SF_6$, $NF_3$, or other suitable gases.

In an example of the first etching process, a CCP etching is applied. In the CCP etching, a processing gas, such as $CF_4$ can be introduced into the etching chamber. The $CF_4$ dissociates to form free F (fluorine) radicals in an etching plasma generated in the etching chamber. The free F radicals further react with the SiO to form volatile by-product SiF4. In some embodiments, $O_2$ can be added into the $CF_4$ gas to increase the F free radical production and hence increases the etch rate as well as makes the etch profile more isotropic. In an example, the first etching process can have a processing temperature in a range from 30° C. to 70° C., a processing pressure from 10 mTorr to 80 mTorr, and a processing time less than 2 minutes.

Figure 4:
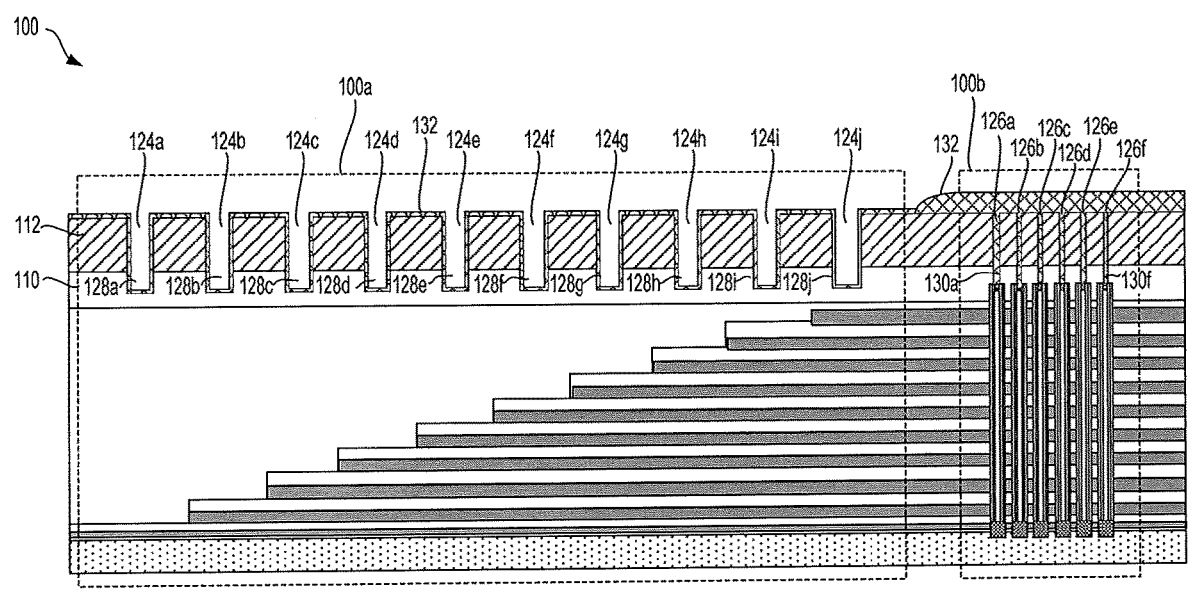

In FIG. 4, a protective (or polymeric) layer 132 can be formed over the first and second patterns of the mask stack 112. According to a microloading effect, a film preferably forms in a microstructure with a relative larger size (opening) than in a microstructure with a relative smaller size (opening). Since the second pattern 124 have a bigger CD than the first pattern 126, the protective layer 132 can have a higher deposition rate in the second pattern 124. By precisely controlling the deposition time and process conditions, the protective layer 132 can accumulate over the first pattern 126 of the mask stack 112 that is positioned over the channel region 100b. In some embodiments, the protective layer 132 may further fill the channel contact openings 130 or partially fill the channel contact openings 130, depending on the process conditions.

In the meanwhile, the protective layer 132 can be uniformly formed along side portions of the first pattern 124, side portions of the first openings 128, and over bottom portions of the first openings 128. The protective layer 132 can further cover a top surface of the mask stack 112, as shown in FIG. 4.

In some embodiments, the protective layer 132 can be a polymer that is formed in a same etching chamber to perform the first etching process. The protective layer 132 can be formed by applying suitable processing gases, such as $C_4F_6$, $C_4F_8$, $CHF_3$, $CH_2F_2$. The processing gases are polymer-forming gases having a relatively low fluorine/carbon (F/C) ratio. Preferably, the F/C ratio of the polymer-forming gas is below 3, and more preferably the F/C ratio of the polymer-forming gas is at most about 2. Suitable polymer-forming gases can be (hydro) fluorocarbon gases that include Freon 134 ($CHF_2$—$CHF_2$), octafluorocyclobutane ($C_4F_8$) and trifluoromethane ($CHF_3$).

Process conditions of forming the protective layer can be different from process conditions of performing the first etching process. For example, the processing gas to form the protective layer 132 can have a higher C to F ratio than the processing gas to perform the first etching process. A processing gas containing hydrogen is preferred to form the protective layer because the processing gas containing hydrogen tends to be polymerizing. In addition, a bias voltage coupled to the substrate 102 can be smaller during formation of the protective layer comparing to a bias voltage coupled to the substrate 102 during the first etching process. In some embodiments, a composition, a density, and a thickness of the protective layer 132 can be adjusted by changing the C to F ratio of the processing gases, a processing pressure, and a processing time. For example, an increasing C to F ratio increases polymerization.

In some embodiments, the protective layer 132 can include hydrocarbon, fluorocarbon, chlorofluorocarbons (CFCs), or other carbonaceous compounds via dissociation of the processing gases in a deposition plasma generated in the etching chamber. An exemplary processing temperature to form the protective layer can be in a range from 10° C. to 70° C., an exemplary processing pressure can be between 10 mTorr and 80 mTorr, and an exemplary processing time can be less than 3 minutes.

In other embodiments, the protective layer 132 can be formed in a different processing chamber rather in the etching chamber, such as a CVD chamber or a diffusion chamber. For example, the protective layer 132 can be formed by applying a chemical vapor deposition (CVD), a hot wire CVD, a parylene polymerization, a plasma enhanced CVD, a plasma assisted CVD, a plasma CVD, a plasma polymerization or a diffusion process.

Figure 5:
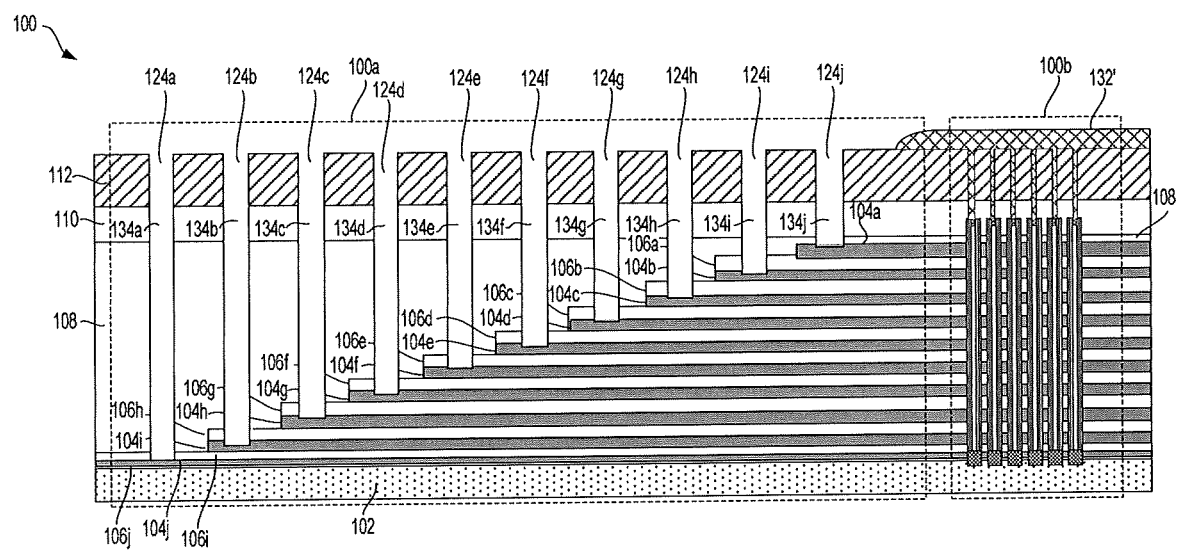

In FIG. 5, a second etching process is performed. The second etching process etches the memory device 100 and transfers the second pattern of the mask stack 112 further into the staircase region of the memory device 100. During the second etching process, the first openings 128 extend through the second dielectric layer 110 and extend into the first dielectric layer 108. By selecting suitable etching gases and etching time, the first openings 128 further extend through the insulating layers 106 and land on the word lines 104. When the second etching process is completed, the first openings 128 become second openings 134. Each of the second openings 134 has side portions and a bottom portion to expose a respective word line. The second openings 134 can have a cylindrical shape, a square pillar-shape, an oval pillar-shape, or other suitable shapes.

During the second etching process, a portion of the protective layer 132 that covers the first openings 128 (shown in FIG. 4) can be removed by an etching plasma generated in the second etching process. A remaining of the protective layer 132 over the first pattern 126 of the mask stack 112 becomes 132'. In the meanwhile, the channel region 100b can be protected by the remaining portion 132' of the protective layer 132 formed over the channel region 100b during the second etching process. In some embodiments, suitable processing gases and process conditions can be selected to help forming additional protective layer over the first pattern of the mask stack 112 in the channel region 100b during the second etching process. Accordingly, the protective layer 132' can include a remaining portion of protective layer 132 over the first pattern of the mask stack 112 in the channel region 110b and an additional portion formed during the second etching process. The remaining portion of the protective layer 132 is covered by the additional portion formed during the second etching process.

Suitable processing gases can be selected in the second etching process to achieve good etching selectivity between the first/second dielectric layers (e.g., SiO) and the word lines (e.g., SiN). For example, the processing gases of the second etching process can include $CF_4$, $C_4F_8$, $C_5F_8$, $SF_6$, $NF_3$, or other suitable gases. In order to achieve a good etch selectivity, a processing time can also be precisely controlled through an end point detecting technique. The second etching process can have a processing temperature in a range from 30° C. to 70° C., a processing pressure from 10 mTorr to 80 mTorr, and a processing time more than 15 minutes.

Figure 6:
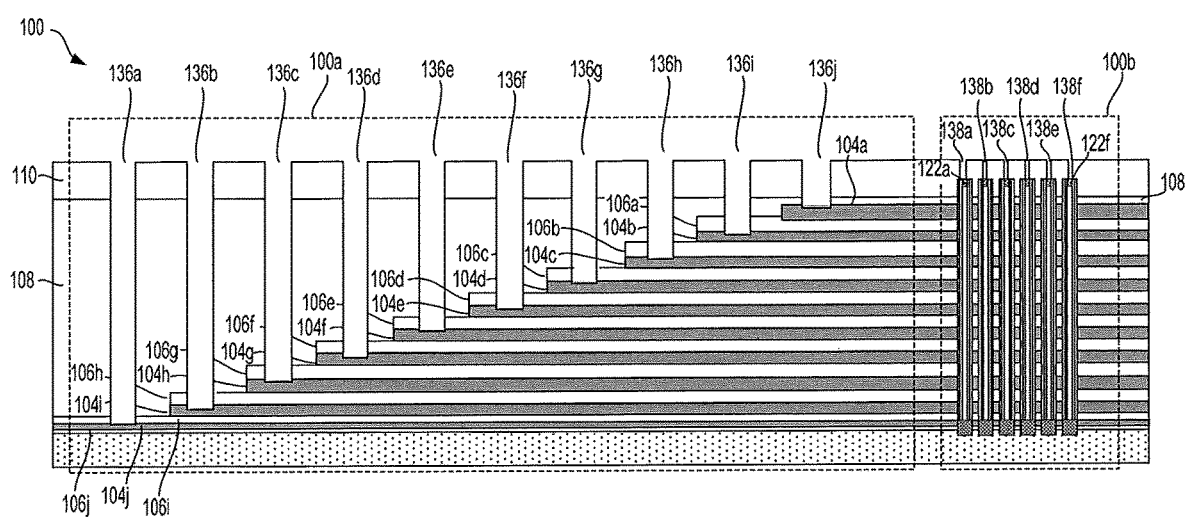

In FIG. 6, a plasma ashing can be applied to remove the mask stack 112 and the remaining protective layer 132'. The plasma ashing can be an in-situ process performed in the etching chamber, or an ex-situ process performed in a strip/ash tool. During the plasma ashing, an $O_2$ gas plus a forming gas (i.e., 3-20% $H_2$ in $N_2$) can be applied to remove the mask stack 112 and the remaining protective layer 132'. The plasma ashing can have a temperature between 100° C. to 300° C., a power from 2000 W to 4000 W, and a pressure from 50 Torr to 200 Torr. Once the plasma ashing is completed, a subsequent wet clean can be applied to remove any remaining ashing residue.

Still referring to FIG. 6, when the mask stack 112 and the remaining protective layer 132' are removed by the second etching process, the second openings 134 becomes word line contact openings 136, and the channel contact openings 130 becomes the bit line contact openings 138. As shown in FIG. 6, the word line contact openings 136 pass through the second dielectric layer 110, extend into the second dielectric layer 108, pass through the insulating layers 106, and land on the word lines 104. Each of the word line contact openings 136 can have a cylindrical shape and expose a respective word line 104. The bit line contact openings 138 are formed in the second dielectric layers 110 and expose the top channel contacts 122. The bit line contact openings 138 can have a cylindrical shape as well. In some embodiments, the word line contact openings 136 can have a CD from 100 nm to 300 nm and a depth from 4 um to 8 um, and the bit line contact openings can have a CD from 20 nm to 80 nm and a depth from 0.1 um to 0.4 um, according to the design requirements.

Figure 7:
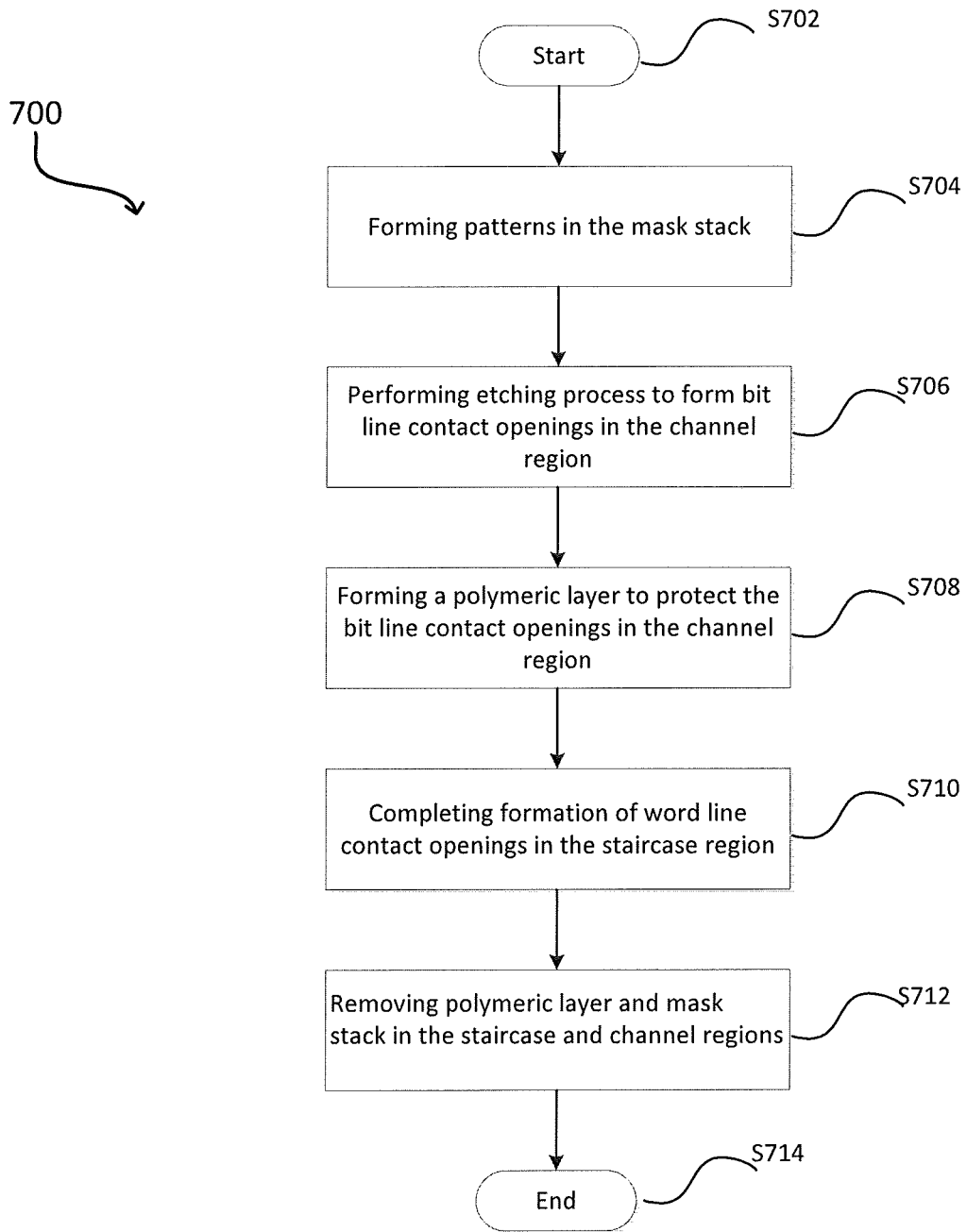
FIG. 7 is a flowchart of a process for manufacturing a 3D-NAND structure, in accordance with exemplary embodiments of the disclosure.

FIG. 7 is a flowchart of a process 700 for manufacturing a 3D NAND memory device in accordance with some embodiments of the present disclosure. The process 700 begins at step 704 where a plurality of patterns are formed over a 3D NAND memory device. The patterns have a first pattern positioned over a channel region of the memory device, and a second pattern positioned over a staircase region of the memory device. The first pattern has a smaller CD than the second pattern. In some embodiments, step 304 can be performed as illustrated with reference to FIG. 1.

The process 700 proceeds to step 706 where a first etching process is performed to transfer the first pattern and the second pattern into the channel region and staircase region, respectively. The first etching process forms a plurality of bit line contact openings in the channel region. Each of the bit line contact openings exposes a respective top channel contact in the channel region. In the meanwhile, the first etching process transfers the second pattern into the staircase region of the memory device to form a plurality of word line trenches. In some embodiment, step 706 can be performed as illustrated with reference to FIG. 3.

In step 708 of the process 700, a protective layer is formed to accumulate over the bit line contact openings in the channel region. The protective layer further fills the bit line contact openings. Due to a microloading effect, the protective layer further uniformly covers the word line trenches formed in the staircase region of the memory device. In some embodiments, the protective layer can be a polymer that is formed in a same etching chamber to perform the first etching process. The protective layer 132 can be formed by applying suitable processing gases, such as $C_4F_6$, $C_4F_8$, $CHF_3$, $CH_2F_2$. Process conditions of forming the protective layer are different from process conditions of performing the first etching process.

In some embodiments, the protective layer 132 can include hydrocarbon, fluorocarbon, chlorofluorocarbons (CFCs), or other carbonaceous compounds via dissociation of the processing gases in a deposition plasma generated in the etching chamber. In other embodiments, the protective layer 132 can be formed in a different processing chamber rather in the etching chamber, such as a CVD processing chamber or a diffusion chamber. For example, the protective layer can be formed by applying a chemical vapor deposition (CVD), a hot wire CVD, a parylene polymerization, a plasma enhanced CVD, a plasma assisted CVD, a plasma CVD, a plasma polymerization or a diffusion process. In some embodiment, step 708 can be performed as illustrated with reference to FIG. 4.

The process 700 then proceeds to step 710 where a second etching process is performed. The second etching process etches the memory device and transfers the second pattern of the mask stack further into the staircase region of the memory device. During the second etching process, the channel region is protected by the protective layer, and the word line trenches extend further into the staircase region of the memory device. When the second etching process is completed, the word line trenches become word line contact openings. The word line contact openings extend into the staircase of the memory device and exposes word lines of the memory device. In some embodiment, step 710 can be performed as illustrated with reference to FIG. 5.

In step 712 of the process 700, a plasm ashing can be applied to remove the mask stack and the protective layer. The plasma ashing can be an in-situ process performed in the etching chamber, or an ex-situ process performed in a strip/ash tool. During the plasma ashing, an $O_2$ gas plus a forming gas (i.e., 3-20% $H_2$ in $N_2$) can be applied to remove the mask stack and the remaining protective layer.

It should be noted that additional steps can be provided before, during, and after the process 700, and some of the steps described can be replaced, eliminated, or performed in different order for additional embodiments of the process 700. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

The various embodiments described herein offer several advantages over related examples. For example, in order to form patterns with different dimensions in a memory device, such as a first pattern with a small CD and a second pattern with a large CD, a related etching process needs more than one mask layers that increase cost and process complexity. In the disclosed etching process, the first and the second patterns of the memory device are formed via a single mask layer. According to the disclosure, the first pattern can be formed by an etching process and then protected by an in-situ formed protective (or polymer) layer. The etching process subsequently completes formation of the second pattern in the microstructure. The protective layer and the mask layer are removed thereafter. The disclosure provides a novel etching process that has a low cost and less process complexity by forming patterns with different dimensions in a single mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a wafer, comprising:
    forming a mask on a microstructure, the mask including a first pattern that is positioned over a first region of the microstructure and a second pattern that is positioned over a second region of the microstructure, the first pattern including a bottom surface and a top surface, the bottom surface of the first pattern being in contact with the first region of the microstructure;
    performing a first etching process, the first etching process etching the microstructure according to the first and second patterns formed in the mask to transfer the first and second patterns of the mask into the first and second regions of the microstructure, respectively;
    forming a protective layer over the first pattern of the mask that is positioned over the first region of the microstructure, the protective layer including a bottom surface and a top surface, the bottom surface of the protective layer being in contact with the top surface of the first pattern of the mask;
    performing a second etching process, the second etching process etching the microstructure and transferring the second pattern of the mask further into the second region of the microstructure, and further forming a coating layer over the top surface of the protective layer that is positioned over the first region of the microstructure; and
    removing the mask and the protective layer from the microstructure.

2. The method of claim 1, wherein forming the mask on the microstructure comprises:
forming the first pattern of the mask over the first region with a first critical dimension; and
forming the second pattern of the mask over the second region with a second critical dimension.

3. The method of claim 2, wherein the first critical dimension is smaller than the second critical dimension.

4. The method of claim 1, wherein the first region of the microstructure is protected by the protective layer during the second etching process.

5. The method of claim 1, wherein the first region of the microstructure comprises a plurality of top channel contacts within a dielectric layer.

6. The method of claim 5, wherein performing the first etching process further comprises:
transferring the first pattern of the mask into the first region to expose the plurality of top channel contacts and form a plurality of channel contact openings within the dielectric layer; and
transferring the second pattern of the mask into the second region to form a plurality of trenches in the dielectric layer, the trenches having side portions and bottom portions.

7. The method of claim 6, wherein forming the protective layer over the first pattern of the mask comprises:
forming the protective layer to fill the plurality of channel contact openings, wherein the protective layer further is accumulated on the top surface of the first pattern of the mask, and is uniformly formed along side portions and bottom portions of the trenches in the second region of the microstructure.

8. The method of claim 1, wherein forming the protective layer over the first pattern of the mask comprises introducing a processing gas to form the protective layer, and the processing gas comprises at least one of carbon element, hydrogen element, or fluorine element.

9. The method of claim 1, wherein performing the second etching process further comprises forming a polymeric layer over the first pattern of the mask that is positioned over the first region of the microstructure.

10. The method of claim 1, wherein the second region of the microstructure comprises a plurality of word lines.

11. The method of claim 10, wherein performing the second etching process comprises transferring the second pattern of the mask further into the second region of the microstructure to expose the plurality of the word lines.

12. The method of claim 1, wherein removing the mask and the protective layer from the microstructure comprises introducing a reacting gas to remove the mask and the protective layer, the reacting gas comprising at least one of a oxygen element, a hydrogen element, or a nitrogen element.

13. The method of claim 1, further comprising:
etching the first and second regions of the microstructure in an etching chamber according to the first and second patterns in the mask respectively;
forming the protective layer over the first pattern of the mask that is positioned over the first region of the microstructure in the etching chamber to protect the first region; and
etching the second region of the microstructure in the etching chamber according to the second pattern in the mask.

14. The method of claim 1, wherein the first and second etching processes are performed in a first processing chamber and the protective layer is formed in a second processing chamber.

15. A method for manufacturing a memory structure, comprising:
forming a mask stack for pattern transfer on the memory structure, the memory structure being formed over a substrate and including at least a channel region and a word line region, the mask stack having a first pattern that is positioned over the channel region and a second pattern that is positioned over the word line region, the first pattern including a bottom surface and a top surface, the bottom surface of the first pattern being in contact with the channel region;
performing a first etching process, the first etching process etching the memory structure according to the first and second patterns formed in the mask stack to transfer the first and second patterns into the channel region and the word line region of the memory structure respectively, a plurality of channel contact openings being formed in the channel region by the first etching process;
forming a protective layer over the first pattern of the mask stack that is positioned over the channel region of the memory structure, the protective layer including a bottom surface and a top surface, the bottom surface of the protective layer being in contact with the top surface of the first pattern of the mask stack;
performing a second etching process, the second etching process etching the memory structure and transferring the second pattern of the mask stack further into the word line region of the memory structure, and further forming a coating layer over the top surface of the protective layer that is positioned over the channel region of the memory structure, a plurality of word line contact openings being formed in the word line region by the second etching process; and
removing the mask stack and the protective layer from the channel region.

16. The method of claim 15, wherein the first and second etching process and forming the protective layer are performed in a same processing chamber.

17. The method of claim 15, wherein the first and second etching processes are performed in a first processing chamber and the protective layer is formed in a second processing chamber.

18. The method of claim 15, wherein the protective layer comprises at least one of a carbon element, a hydrogen element, or a fluorine element.

19. A method for processing a 3D-NAND structure, comprising:
forming a mask stack for pattern transfer on a 3D-NAND structure, the 3D-NAND structure being formed over a substrate and including a channel region and a staircase region, the channel region including a plurality of top channel contacts within a dielectric layer and the staircase region including a plurality of word lines stacked in a staircase configuration, the mask stack including one or more layers;
forming first and second patterns in the mask stack, the first pattern being positioned over the channel region and the second pattern being positioned over the staircase region, the first pattern having a smaller critical dimension (CD) than the second pattern, and including a bottom surface and a top surface, the bottom surface of the first pattern being in contact with the channel region;

etching the 3D-NAND structure according to the first and second patterns formed in the mask stack to transfer the first and second patterns of the mask stack into the 3D-NAND structure, the first pattern of the mask stack being transferred to the channel region to expose the plurality of top channel contacts and form a plurality of channel contact openings within the dielectric layer;

forming a protective layer over the first pattern of the mask stack that is positioned over the channel region of the 3D-NAND structure, the protective layer covering the channel region and further filling the plurality of channel contact openings, the protective layer including a bottom surface and a top surface, the bottom surface of the protective layer being in contact with the top surface of the first pattern of the mask stack;

etching the 3D-NAND structure to transfer the second pattern of the mask stack further into the staircase region and form a coating layer over the top surface of the protective layer that is positioned over the channel region of the 3D-NAND structure, the second pattern of the mask stack being transferred into the staircase region to expose the plurality of the word lines and form a plurality of word line contact openings in the staircase region; and removing the mask stack and the protective layer from the 3D-NAND structure.

20. The method of claim 19, wherein the first and second etching processes and the formation of the protective layer are performed in a same processing chamber.

* * * * *